(12) United States Patent
Kozinsky et al.

(10) Patent No.: US 7,626,316 B2
(45) Date of Patent: Dec. 1, 2009

(54) PASSIVE SELF-TUNING RESONATOR SYSTEM

(75) Inventors: Inna Kozinsky, Pasadena, CA (US);
Brian Stark, Los Altos, CA (US);
Robert Candler, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 84 days.

(21) Appl. No.: 11/904,811

(22) Filed: Sep. 28, 2007

(65) Prior Publication Data
US 2009/0085442 A1   Apr. 2, 2009

(51) Int. Cl.
*H01L 41/08* (2006.01)
(52) U.S. Cl. .................. 310/339; 310/321; 310/319
(58) Field of Classification Search ......... 310/319–321, 310/328, 317, 339, 318; *H01L 41/08, 41/113*
See application file for complete search history.

(56) References Cited

U.S. PATENT DOCUMENTS

| | | | |
|---|---|---|---|
| 6,407,484 | B1 | 6/2002 | Oliver et al. |
| 6,858,970 | B2 | 2/2005 | Malkin et al. |
| 6,954,025 | B2 | 10/2005 | Nishida et al. |
| 7,057,330 | B2 | 6/2006 | Buhler et al. |
| 7,105,982 | B1 | 9/2006 | Hagood, IV et al. |
| 2005/0146220 | A1* | 7/2005 | Hamel et al. .................. 307/44 |
| 2009/0195222 | A1* | 8/2009 | Lu et al. ...................... 310/321 |

OTHER PUBLICATIONS

Boudaoud et al., "Self-Adaptation in Vibrating Soap Films," *Physical Review Letters*, vol. 82, No. 19, pp. 3847-3850, May 10, 1999, (4 pages).
Boudaoud et al., "A self-adaptative oscillator," *The European Physical Journal B*, Eur. Phys. J. B 9, 159-165 (1999) (7 pages).

* cited by examiner

*Primary Examiner*—Walter Benson
*Assistant Examiner*—Karen B Addison
(74) *Attorney, Agent, or Firm*—Maginot, Moore & Beck

(57) ABSTRACT

The invention is a system incorporating a self-tuning resonator and method of self-tuning a resonator within a system. In one embodiment, a method of powering a system with energy harvested from a vibrating surface includes receiving a first mechanical energy at a first driving frequency from the vibrating surface, transferring the received first mechanical energy to a suspended structure within the system, vibrating the suspended structure with the transferred first mechanical energy, passively adjusting the resonant frequency of the suspended structure to a first resonant frequency associated with the first driving frequency by moving a movable mass in response to the movement of the suspended structure, vibrating the adjusted suspended structure with the transferred first mechanical energy, generating electrical energy using the vibrations of the adjusted suspended structure, and powering the system with the generated electrical energy.

16 Claims, 7 Drawing Sheets

PASSIVE SELF-TUNING RESONATOR SYSTEM

FIELD OF THE INVENTION

This invention relates to the field of systems incorporating energy scavengers and more particularly to systems incorporating mechanical energy harvesters.

BACKGROUND OF THE INVENTION

Energy harvesters may be used to convert mechanical energy to electrical energy. The harvesting system typically includes a component that vibrates in response to mechanical energy passed to the harvesting system. For example, the harvesting system may be attached to a motor or other piece of equipment which vibrates. The conversion of mechanical energy to electrical energy may be accomplished using piezoelectric devices, capacitor devices or magnetic devices. In these systems, the most efficient conversion of energy from mechanical to electrical occurs when the resonant frequency corresponds to the frequency of the received vibration. In general, the conversion of mechanical energy to electrical energy may be quantified using the following equation:

$$|P| = \frac{m\xi_e \omega^3 \left(\frac{\omega}{\omega_n}\right)^2 Y^2}{\left(2\zeta_T \frac{\omega}{\omega_n}\right)^2 + \left(1 - \left(\frac{\omega}{\omega_n}\right)^2\right)^2}$$

wherein
P is the power that may be harvested,
m is the mass of the vibrating component,
$\xi_e$ is the electrical damping ratio,
$\omega$ is the excitation frequency,
$\omega_n$ is the natural frequency of the harvesting system,
Y is the amplitude of external vibration, and
$\zeta_T$ is the total damping ratio.

Thus, the harvested power is maximized when the ratio of the excitation frequency to the natural frequency of the system approaches 1.

Harvesting systems that are to be used to harvest energy from a source that vibrates at a single dominant frequency may include a resonator tuned to the particular dominant frequency. This may be accomplished, for example, by adding a mass to a spring or lever arm so as to modify the resonant frequency of the spring or lever arm. For systems that vibrate at various discrete frequencies, the resonator used in the harvesting system may include different springs or levers tuned to the various frequencies or a number of different resonators, each tuned to a different frequency.

One can also employ devices which incorporate active components that are used to tune the resonant frequency of the resonator to the frequency then experienced by the device. Active components, however, require some amount of the harvested energy to be consumed, thereby reducing the effective output of the harvesting system.

Accordingly, it would be advantageous to provide a mechanical energy harvesting system with a tunable resonator. It would be further advantageous if harvested energy was not required to tune the resonator.

SUMMARY OF THE INVENTION

Some limitations of previously known systems incorporating mechanical energy harvesters may be overcome by a system incorporating a passive self-tuning resonator or a method of passively self-tuning a resonator within a system. In one embodiment, a method of powering a system with energy harvested from a vibrating surface includes receiving a first mechanical energy at a first driving frequency from the vibrating surface, transferring the received first mechanical energy to a suspended structure within the system, vibrating the suspended structure with the transferred first mechanical energy, passively adjusting the resonant frequency of the suspended structure to a first resonant frequency associated with the first driving frequency by moving a movable mass in response to the movement of the suspended structure, vibrating the adjusted suspended structure with the transferred first mechanical energy, generating electrical energy using the vibrations of the adjusted suspended structure, and powering the system with the generated electrical energy.

In a further embodiment, a wireless device includes a support structure configured to receive mechanical energy generated by a vibrating source external to the device, a vibratory member operatively connected to the support structure for receiving mechanical vibrations from the support structure, and a power harvesting subsystem including a resonator with at least one resonant frequency adjustment mass movably responsive to the vibratory member, such that vibration of the vibratory member causes the at least one resonant frequency adjustment mass to move thereby changing the resonant frequency of the vibratory member from a first resonant frequency to a second resonant frequency.

In yet another embodiment, a sensing device includes a sensor configured to provide output indicative of a sensed condition, a memory, a microprocessor configured to obtain the output from the sensor and to store data associated with the output within the memory, and a power harvesting subsystem including a resonator with a suspended structure configured to move a resonant frequency adjustment mass such that movement of the resonant frequency adjustment mass causes the resonant frequency of the suspended structure to change.

BRIEF DESCRIPTION OF THE DRAWINGS

The present invention may take form in various system components and arrangement of system components. The drawings are only for purposes of illustrating exemplary embodiments and are not to be construed as limiting the invention.

DESCRIPTION

Figure 1:
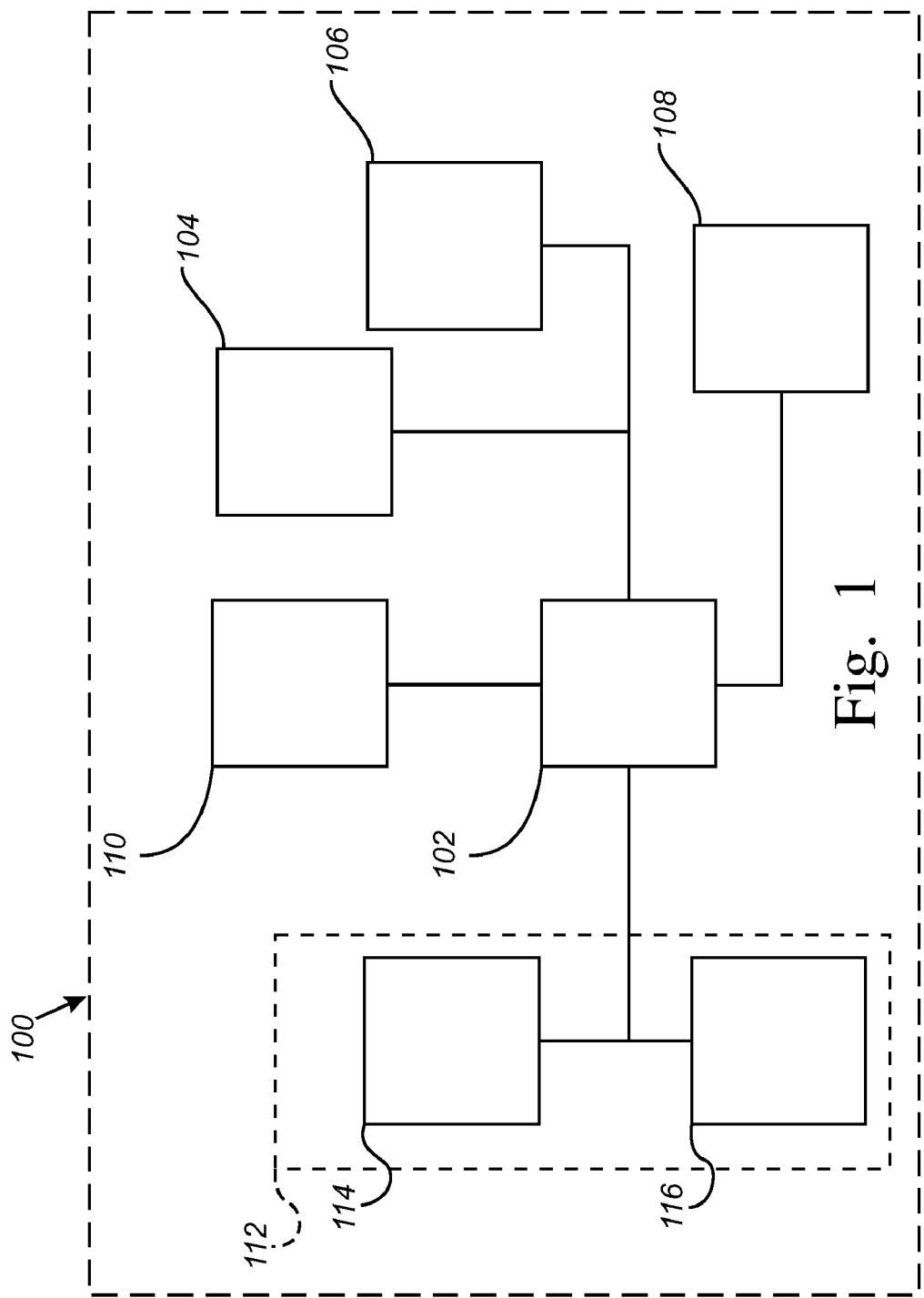
FIG. 1 shows a schematic diagram of a wireless sensor system powered by a passive self-tuning energy harvesting resonator incorporating features of the present invention.

Referring to FIG. 1, the system 100 includes a microprocessor 102, a receiver 104, and a transmitter 106. The receiver 104 and the transmitter 106 allow communication between the system 100 and an external device. In the embodiment of FIG. 1, the receiver 104 is used exclusively to receive data over a link which may incorporate radio frequency, inductive coupling, or any other acceptable means for communication. In alternative embodiments, the receiver may additionally function as an energy harvesting device.

The system 100 in this embodiment is a wireless sensor. Accordingly, the system 100 includes a sensor 108. The sensor 108 provides an output indicative of a sensed condition to the microprocessor 102. The microprocessor 102 is configured to execute commands stored in a memory 110 which cause data associated with the output of the sensor to be stored in the memory 110.

Power for the system 100 is provided from a power harvesting subsystem 112 which includes a resonator 114 and a storage device 116. The storage device 116 may be a battery which is charged with the resonator 114. In alternative embodiments, different types of storage devices may be used or storage devices may be omitted. Additionally, while the resonator 114 in this embodiment includes a single device, two or more resonators may be provided depending on the particular power needs and design characteristics of the system.

Figure 2:
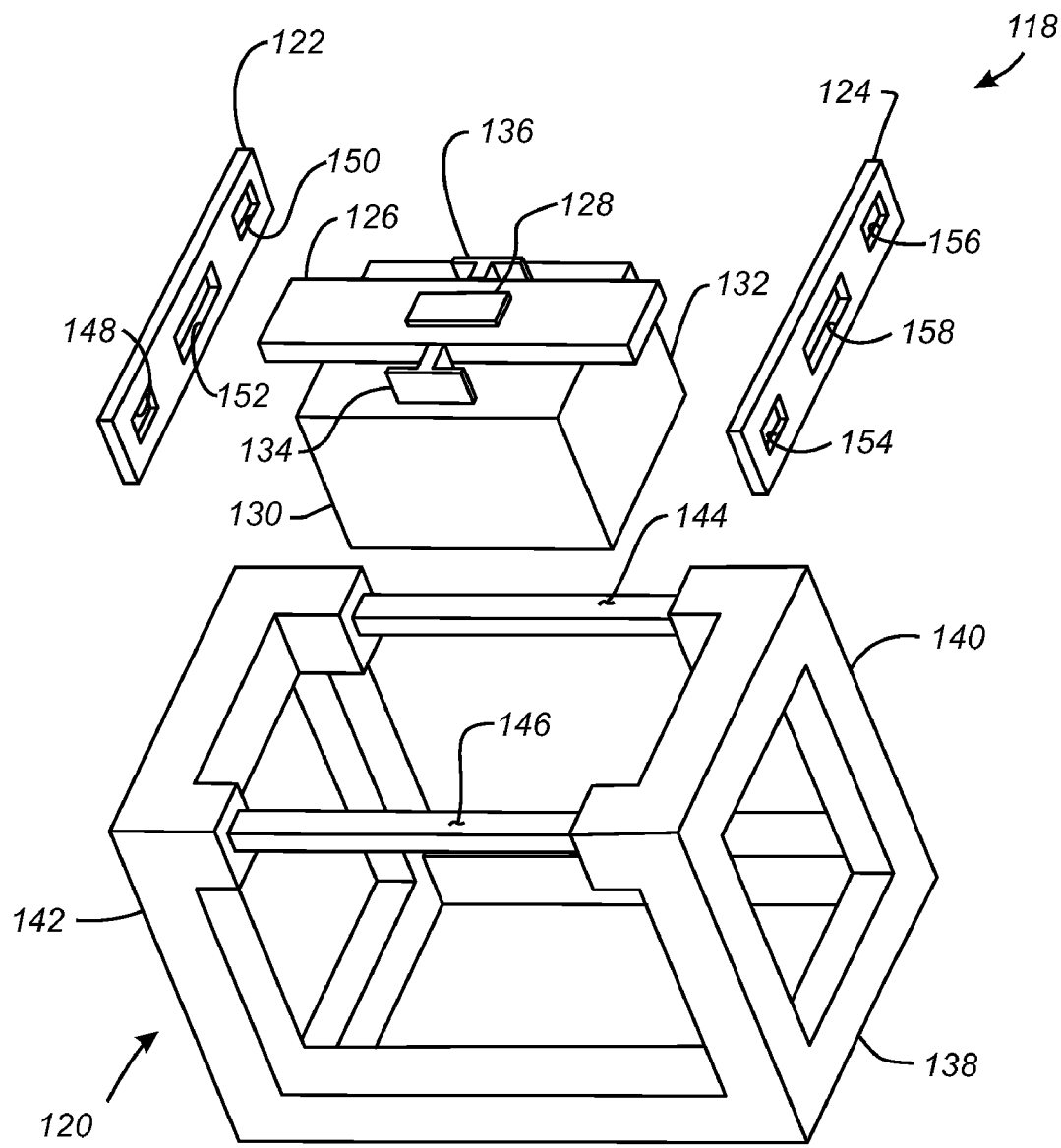
FIG. 2 shows a partially exploded perspective view of a resonator incorporating a suspended member in the form of a spring that may be used with the system of FIG. 1.

The resonator 114, along with other components of the system 100, may be fabricated using microelectrical mechanical system (MEMS) processes, nanoelectrical mechanical system (NEMS) processes, semiconductor processes, or even traditional molding and machining processes. One example of a resonator that may be used with the system 100 is the resonator 118 shown in FIG. 2.

The resonator 118 includes a support structure 120, transfer arms 122 and 124 and a spring 126. A piezoelectric component 128 and a mass member 130 are attached to the spring 126. The mass member 130 includes a body 132 and two spacer flanges 134 and 136. The support structure 120 includes a base 138 and side frames 140 and 142. Two support beams 144 and 146 extend between the side frames 140 and 142 and above the base 138.

The transfer arm 122 includes two support openings 148 and 150 and a spring opening 152. The support openings 148 and 150 are sized to slidingly receive the support beams 146 and 144, respectively. To this end, the height of the openings 148 and 150 are configured to be slightly higher than the height of the support beams 144 and 146 such that when assembled, relative movement is possible between the transfer arm 122 and the support beams 144 and 146 but there is not a significant gap between the upper and lower surfaces of the openings 142 and 144 and the upper and lower surfaces of the support beams 144 and 146, respectively. The transfer arm 124 is identical to the transfer arm 122, including two support openings 154 and 156 and a spring opening 158.

Figure 3:
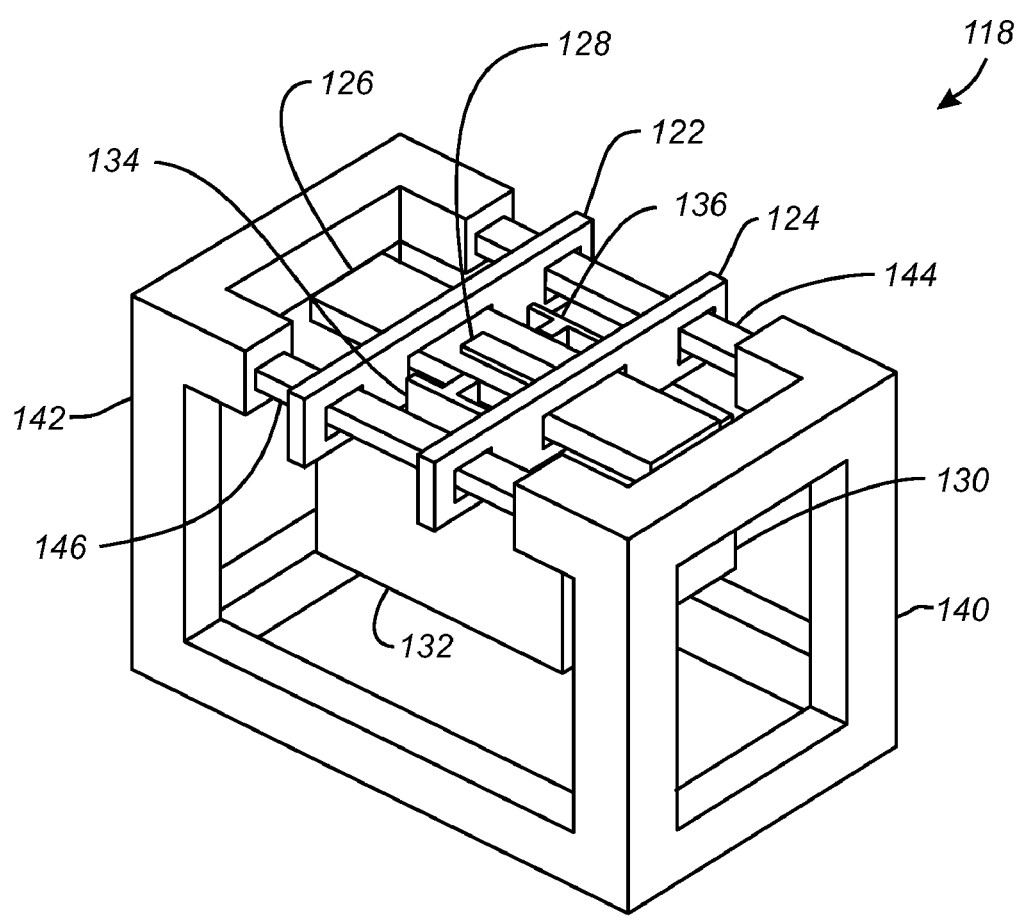
FIG. 3 shows a perspective view of the resonator of FIG. 2 with the spring slidingly supported by transfer arms which are slidingly supported by support beams.
Figure 4:
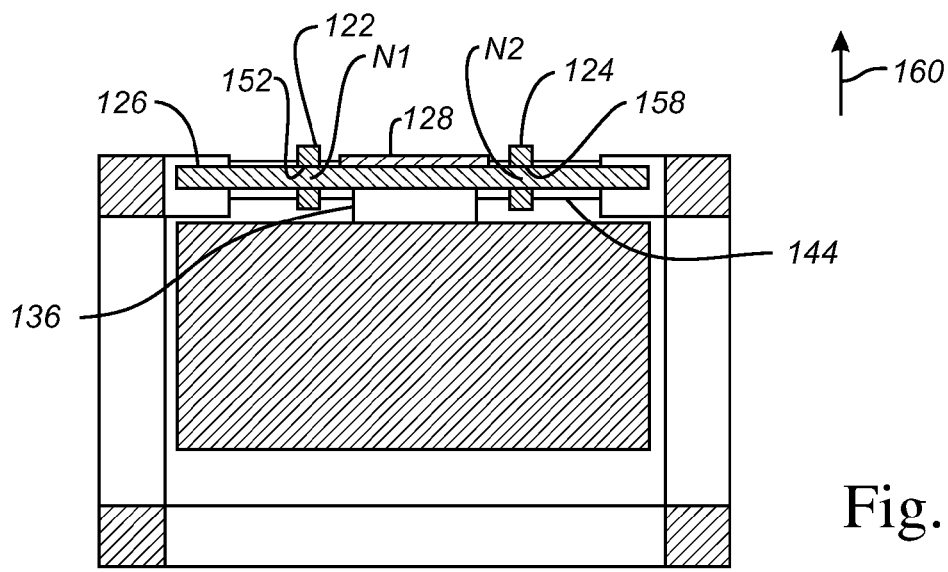
FIG. 4 shows a side cross-sectional view of the resonator of FIG. 2 with one transfer arm positioned closer to the center of the spring than the other transfer arm.

When assembled, as shown in FIG. 3, the transfer arms 122 and 124 support the spring 126. The height of the spacer flanges 134 and 136 is selected such that the body 132 of the mass member 130 does not inhibit movement of the transfer arms 122 and 124 as best seen in FIG. 4. The spacer flanges 134 and 136 extend upwardly from the body 132 between the transfer arms 122 and 124 thereby maintaining a minimum separation between the transfer arms 122 and 124.

When a system such as the system 100 incorporates a resonator 118, the system is preferentially configured such that the plane in which the spring 126 flexes is parallel to the predominant axis of the targeted vibrations. For example, the spring 126 is configured to flex primarily back and forth in the direction of the arrow 160 in FIG. 4. Accordingly, positioning the resonator 118 on a device such that the predominant axis of the targeted vibrations is parallel to the arrow 160 maximizes the energy from the vibration that is available for conversion.

When the resonator 118 is positioned on a device which is not presently vibrating, the resonator 118 may initially be in the condition shown in FIGS. 3 and 4. In this condition, the position of the transfer arms 122 and 124 along the support beams 144 and 146 is constrained primarily by the relative dimensions of the support openings 148, 150, 152 and 156 and the support beams 144 and 146. Likewise, the orientation of the spring 126 is constrained primarily by the relative dimensions of the spring 126 and the spring openings 152 and 158. Accordingly, the location of the spring 126 with respect to the transfer arms 122 and 124 may not be symmetrical. For example, FIG. 4 shows the transfer arm 122 located slightly closer to the piezoelectric component 128 than the transfer arm 124. Additionally, the spring 126 may not be centered between the frames 140 and 142. Likewise, the spring 126 may not be parallel to the support beams 144 and 146.

Once the device upon which the resonator 118 is placed begins to vibrate at a first drive frequency, the mechanical energy of the vibration is passed from the device to the base 138, either directly or through other components such as the housing of the system in which the resonator 118 is located. The mechanical energy is passed from the base 138 to the side frames 140 and 142, all of which vibrate at the first drive frequency. Likewise, the support beams 144 and 146, which are made of an acceptably stiff material, vibrate at the first drive frequency. Moreover, because the base 138, the side frames 140 and 142, and the support beams 144 and 146 are moving as a unit, the movements of the support beams 144 and 146 are synchronized.

For the purposes of the following example, the driving frequency is assumed to initially cause movement of the resonator 118 in the direction of the arrow 160. As the support beams 144 and 146 move in the direction of the arrow 160, the transfer arms 122 and 124 are moved in the direction of the arrow 160, causing the portions of the spring 126 located between the upper and lower surfaces of the spring openings 152 and 158 to move in the direction of the arrow 160 at the first frequency. These areas of the spring 126 are the initial nodes of the spring 126. The initial nodes of the spring 126 which are defined by the spring openings 152 and 158 are identified in FIG. 4 as N1 and N2, respectively.

Figure 5:
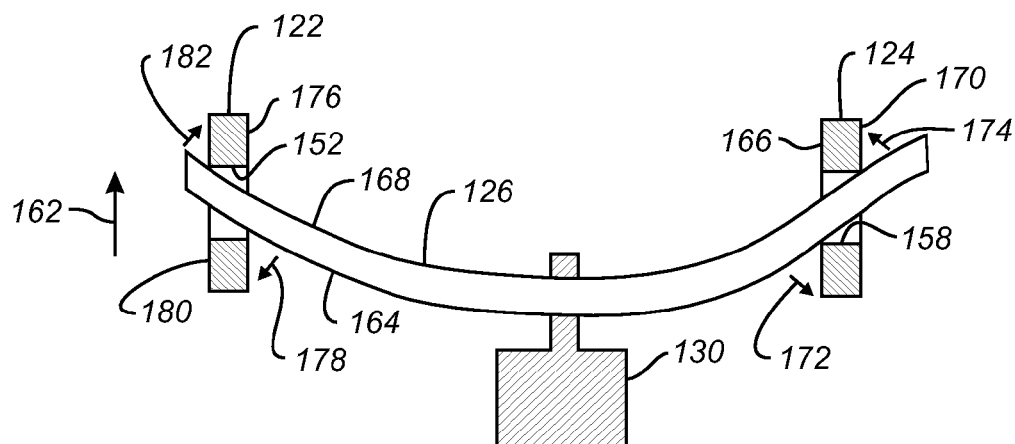
FIG. 5 shows an exaggerated simplified side view of the spring of the resonator of FIG. 2 exerting torque of different magnitudes on the transfer arms in response to a first half of a cycle of a driving frequency whereby the spring biases the transfer arms thereby passively modifying the resonant frequency of the system.

As the nodes N1 and N2 initially move in the direction of the arrow 160. The inertia of the mass member 130 resists any movement. Accordingly, the flexible nature of the spring 126 allows the spring 126 to initially flex as shown in FIG. 5 as movement of the nodes N1 and N2 precedes movement of the central portion of the spring 126. As the spring 126 flexes, the piezoelectric component 128 which is located at the central portion of the spring 126 is flexed, thereby translating the mechanical movement of the vibration applied to the resonator 118 into electrical energy.

Figure 6:
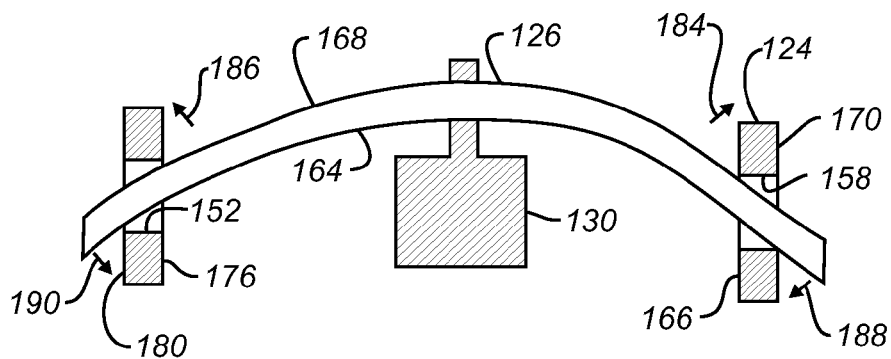
FIG. 6 shows an exaggerated simplified side view of the spring of the resonator of FIG. 2 exerting torque of different magnitudes on the transfer arms in response to a second half of a cycle of a driving frequency whereby the spring biases the transfer arms thereby passively modifying the resonant frequency of the system in accordance with principles of the invention.

As the driving frequency causes the resonator 118 to reverse direction, the nodes N1 and N2 reverse direction. The mass member 130 initially continues to move in the direction of the arrow 160 allowing the spring 126 to resume its original shape. The inertia of the mass member 130 at this point is still in the direction of the arrow 160 while the nodes N1 and N2 are moving in the opposite direction. Accordingly, the spring 126 is flexed in the direction opposite to the initial flexure as shown in FIG. 6 resulting in the generation of more electrical energy in the manner discussed above.

Accordingly, the movement of the nodes N1 and N2 define two axes which together define a flexing plane. Within the flexing plane, the point at which the mass member 130 is attached to the spring 126 defines an antinode for the resonator 118.

As the spring 126 is flexed, a torque is applied to the transfer arms 124 and 126. This is explained with reference to FIGS. 5 and 6 which are simplified and exaggerated depictions of portions of the resonator 118. As the transfer arms 122 and 124 move in the direction of the arrow 162, the spring 126 flexes as discussed above. As the spring 126 flexes, the lower surface 164 of the spring 126 contacts the inner wall 166 of the transfer arm 124 at the lower portion of the spring opening 158 resulting in a force in the direction of the arrow 172. At the same time, the upper surface 168 of the spring 126 contacts the outer wall 170 of the transfer arm 124 at the upper portion of the spring opening 158 resulting in a force in the direction of the arrow 174. Accordingly, a counter-clockwise torque is applied to the transfer arm 124.

Similarly, as the spring 126 flexes in the manner shown in FIG. 5, the lower surface 164 of the spring 126 contacts the inner wall 176 of the transfer arm 122 at the lower portion of the spring opening 152 resulting in a force in the direction of the arrow 178 while the upper surface 168 of the spring 126 contacts the outer wall 180 of the transfer arm 122 at the upper portion of the spring opening 152. Accordingly, a clockwise torque is applied to the transfer arm 122.

When the flexure of the spring 126 is reversed, as shown in FIG. 6, the upper surface 168 contacts the inner walls 166 and 176 at the upper portions of the spring openings 158 and 152, respectively, resulting in forces in the direction of the arrows 184 and 186, respectively. Additionally, the lower surface 164 contacts the outer walls 170 and 180 at the lower portions of the spring openings 158 and 152, respectively, resulting in forces in the direction of the arrows 188 and 190, respectively. Thus, the transfer arm 122 is torques in a counter-clockwise direction while the transfer arm 124 is torqued in a clockwise direction.

Thus, each transfer arm is torqued in both a counter-clockwise direction and a clockwise direction during a complete cycle. In the example of FIG. 4, the mass member 130 is closer to the transfer arm 124 and the spacing of the transfer arms 122 and 124 is less than ½ of the wavelength ($\lambda$) of the resonant frequency of the system 100 for the driving frequency. Accordingly, the forces in the direction of the arrows 172 and 184 are larger than the forces in the directions of the arrows 174 and 188. Accordingly, the transfer arm 124 is biased by the spring 126 in a direction away from the mass member 130 which defines the antinode of the spring 126.

Therefore, because the transfer arms 122 and 124 are free to slide along the support beams 144 and 146, the bias generated by the spring 126 and the mass member 130 causes movement of the transfer arms 122 and 124 so as to center the spring 126 and the mass member 130 between the transfer arms 122 and 124. A similar process forces the spring 126 to an orientation perpendicular to the transfer arms 122 and 124 and parallel with the support beams 144 and 146. Thus, when the resonator is in the configuration of FIG. 4, the spring 126 forces the transfer arm 122 to the position shown in FIG. 7 which is to the left with respect to the position of the transfer arm 122 in FIG. 4. The transfer arm 122 thus defines a new node N1'. The nodes N1' and N2 are symmetrically spaced apart from the antinode of the spring 126.

Figure 8:
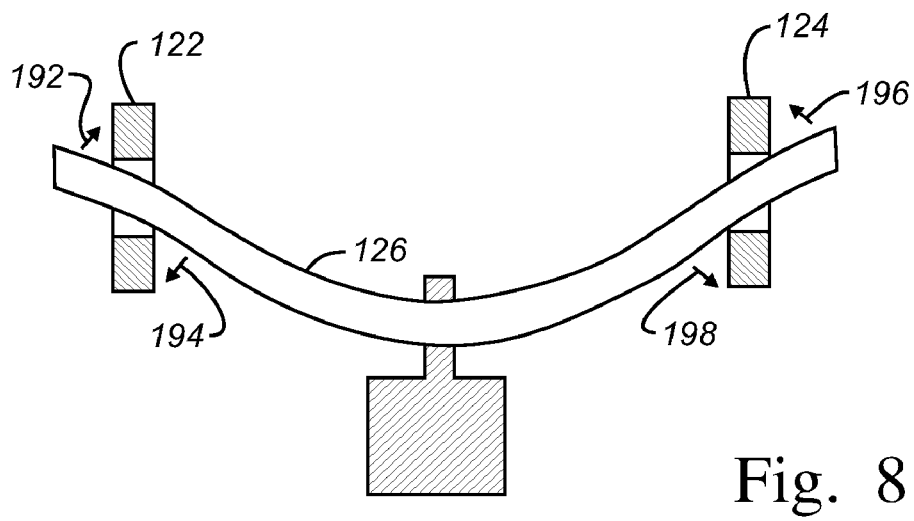
FIG. 8 shows an exaggerated simplified side view of the spring of the resonator of FIG. 2 exerting torque of equal magnitudes on the transfer arms in response to a first half of a cycle of a driving frequency while the spring is vibrating at the resonant frequency of the system for the driving frequency.
Figure 9:
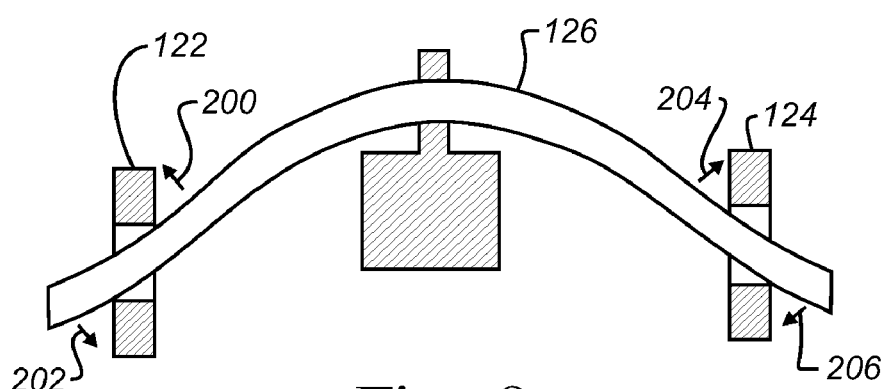
FIG. 9 shows an exaggerated simplified side view of the spring of the resonator of FIG. 2 exerting torque of equal magnitudes on the transfer arms in response to a second half of a cycle of a driving frequency while the spring is vibrating at the resonant frequency of the system for the driving frequency.

The nodes N1' and N2 are thus spaced apart at a distance which is a multiple of ½ of the wavelength ($\lambda$) of the spring 126 while the piezoelectric component 128 spans an antinode of the spring 126. In the event the frequency of the spring 126 defined by the nodes N1' and N2 is the resonant frequency of the spring 126 for the first drive frequency, a standing wave will be generated within the spring 126 which entraps the transfer arms 122 and 124 thereby maintaining the nodes N1' and N2 at locations which define the resonant frequency of the spring 126 for the first drive frequency. By way of explanation, the forces exerted on the transfer arms 122 and 124 for a full cycle of flexure by the spring 126 when the spring 126 is vibrating at the harmonic frequency for a particular driving frequency are shown in FIGS. 8 and 9. Each of the forces identified by the arrows 192, 194, 196, 198, 200, 202, 204 and 206 are of equal magnitude. Accordingly, the spring 126 does not bias the transfer members 122 and 124 predominantly outwardly or inwardly. Moreover, because the piezoelectric component 128 spans an antinode of the spring 126, bending of the piezoelectric component 128, and thus generation of electrical energy, is maximized.

In the event, however, that the frequency of the spring 126 defined by the nodes N1' and N2 is not the resonant frequency of the spring 126 for the first drive frequency a standing wave will not form in the spring 126. Similarly, if the frequency of the spring 126 defined by the nodes N1' and N2 is the resonant frequency of the spring 126 for the first drive frequency but the drive frequency is changed, the standing wave will be destroyed.

In either event, the transfer arms 122 and 124 are not "trapped" by a standing wave and the movement of the spring 126 and the mass member 130 biases the transfer arms 122 and 124 toward positions whereat the frequency of the spring 126 defined by the nodes at the spring openings 152 and 158 is the resonant frequency of the spring 126.

Figure 7:
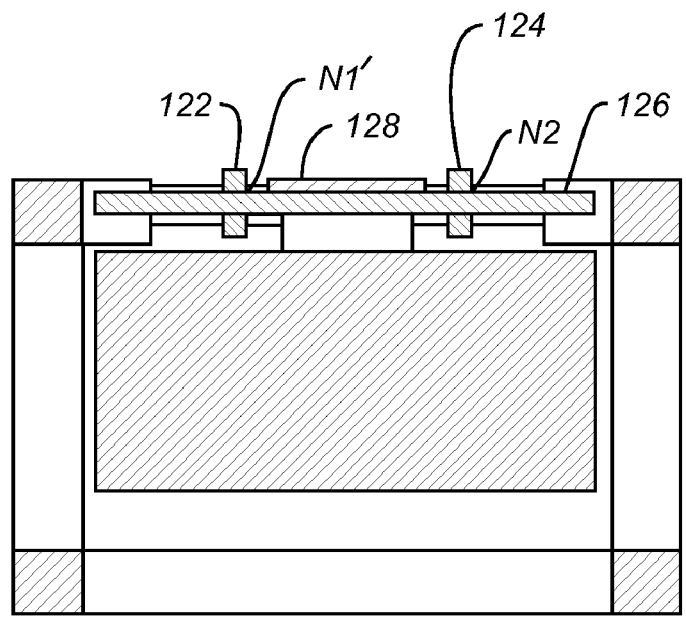
FIG. 7 shows a side cross-sectional view of the resonator of FIG. 4 after the spring bias has caused the transfer arms to be moved to positions equidistant from the center of the spring.
Figure 10:
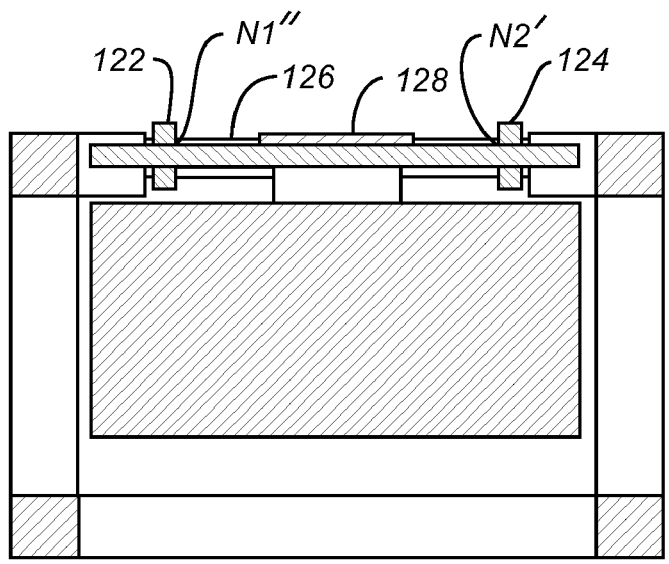
FIG. 10 shows a side cross-sectional view of the resonator of FIG. 4 after the spring bias has caused the transfer arms to be moved to positions whereat the transfer arms define nodes for the harmonic frequency of the system for the received drive frequency; so as to maximize the translation of mechanical energy to electrical energy by the piezoelectric component.
Figure 11:
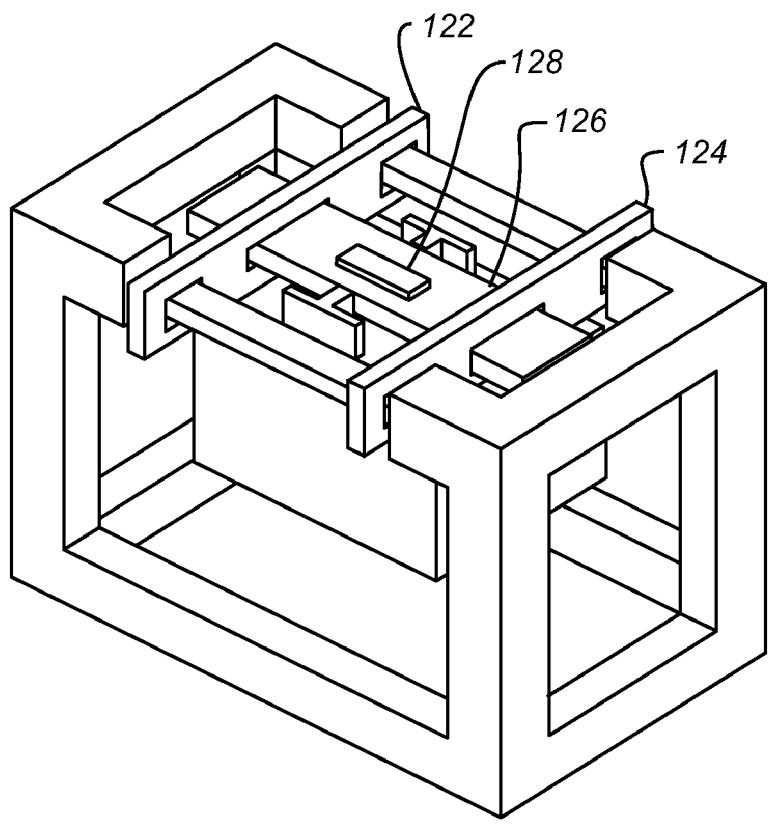
FIG. 11 shows a perspective view of the resonator of FIG. 4 in the condition of FIG. 10.

Depending upon the initial starting position as well as the resonant frequency for the new drive frequency, the transfer arms 122 and 124 may be biased away from each other or toward each other. In the example of FIGS. 4 and 7, the transfer arms 122 and 124 are biased outwardly, away from each other, to the positions shown FIGS. 10 and 11 wherein the transfer arms 122 and 124 have shifted away from each other. The transfer arm 122 thus defines a new node N1" while the transfer arm 124 defines a new node N2' and the frequency of the spring 126 defined by the nodes N1" and N2' is the resonant frequency of the spring 126 for the drive frequency.

Figure 12:
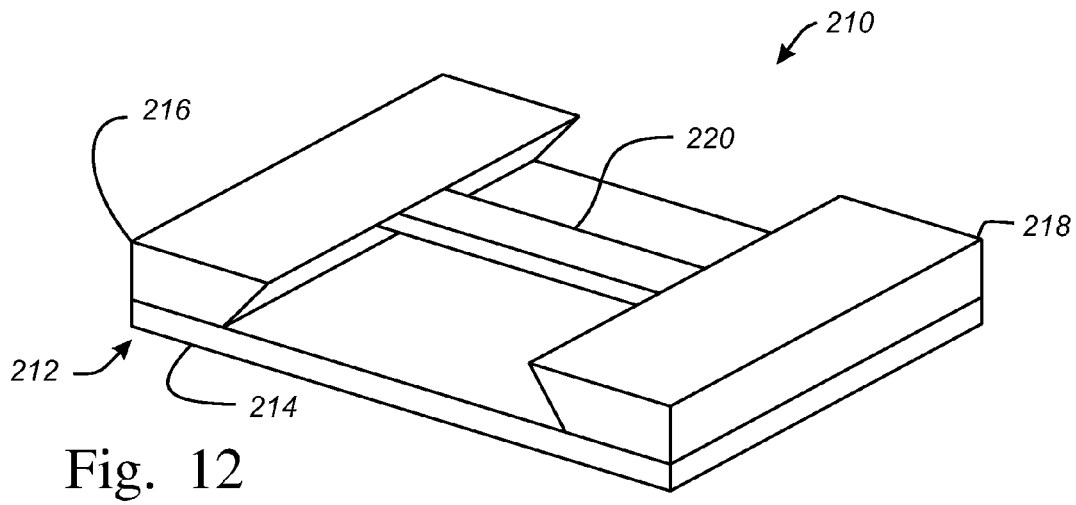
FIG. 12 shows a perspective view of an alternative resonator with a suspended member that may be used with the system of FIG. 1 incorporating features of the present invention.

Referring to FIG. 12, an alternative resonator 210 is described. The resonator 210 includes a support 212 having a base 214 and two frames 216 and 218. A suspended structure 220 extends between the frames 216 and 218. The base 214 and the frames 216 and 218 may be fabricated using any acceptable material such as silicon or plastic. In one embodiment, the frames 216 and 218 are formed from a conductive material while the base 214 is formed from a non-conductive material.

Figure 13:
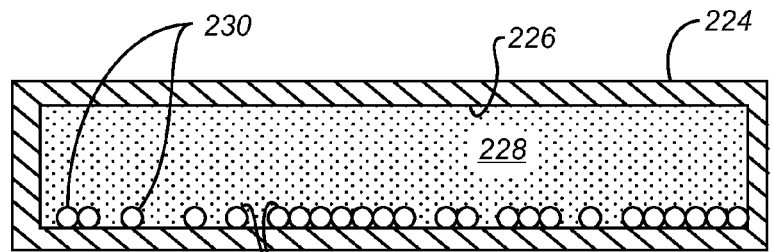
FIG. 13 shows a side cross-sectional view of one of the suspended members of FIG. 12 with a plurality of negatively buoyant nanobeads within a fluid filled chamber defined by a resilient outer shell.

As shown in FIG. 13, the suspended structure 220 includes a resilient outer shell 224 which defines a channel 226. In one embodiment, the outer shell may be formed from a parylene material. The channel 226 is filled with a fluid 228 which may be a liquid or a gas. A number of beads 230 are located within the channel 226. In this embodiment, the beads 230 are glass nanobeads which are negatively buoyant in the fluid 228.

The resonator 210 operates in a manner similar to the resonator 118. One difference is that when the ends of the suspended structure 220 are moved by the frames 216 and 218, the mass of the suspended structure 220 along with the fluid 228 and the beads 230 provide sufficient inertia to cause the suspended structure 220 to flex. Additionally, the beads 230 initially have a greater inertia than comparable volumes of the fluid 228. Accordingly, the beads 230 each act in a manner similar to the mass member 130, each bead 230 tending to create an antinode within the suspended structures 220 and 222.

Figure 14:
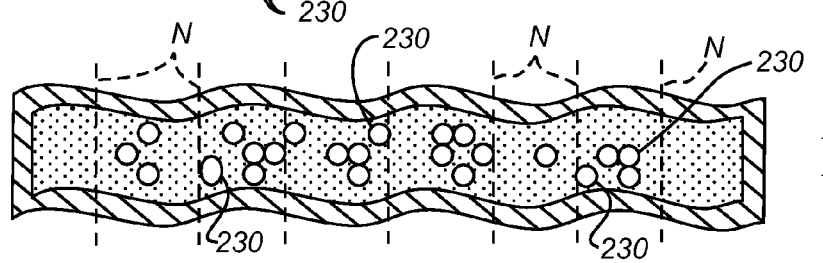
FIG. 14 shows a side cross-sectional view of one of the suspended members of FIG. 12 with the plurality of negatively buoyant nanobeads forming various antinodes in response to a driving frequency causing vibration of the suspended member.

Continued vibration of the suspended structure 220 biases the beads 230 into antinodal groups as shown in FIG. 14 as the frequency of the suspended structure 220 approaches the resonant frequency associated with the received mechanical energy. The antinodes formed by the groups of beads 230 thus define nodes N within the suspended structure 220 which are spaced apart at a distance which is a multiple of the wavelength (λ) of the resonant frequency of the suspended structure 220.

While a single suspended structure 220 is shown in this embodiment, in alternative embodiments more than one suspended structure is provided. Additionally, the suspended structures may be designed to be adjustable to resonant frequencies of different bands, such as by varying the resiliency of the shell. Thus, even in an environment which exhibits wide frequency variations, at least one vibratory structure in a harvesting device can be driven at a resonant frequency.

Additionally, a number of different design variations may be incorporated into an energy harvesting device incorporating principles of the invention. In one such alternative shown in FIG. 15, a suspended structure 232 includes a resilient outer shell 234 which defines a channel 236. The channel 236 is filled with a fluid 238. A number of beads 240 are located within the channel 236. In this embodiment, the beads 240 are positively buoyant in the fluid 238. Thus, when the suspended structure 123 is vibrated, the heavier fluid 238 is biased toward areas which define antinodes while the beads 240 are forced toward the nodes N.

Figure 15:
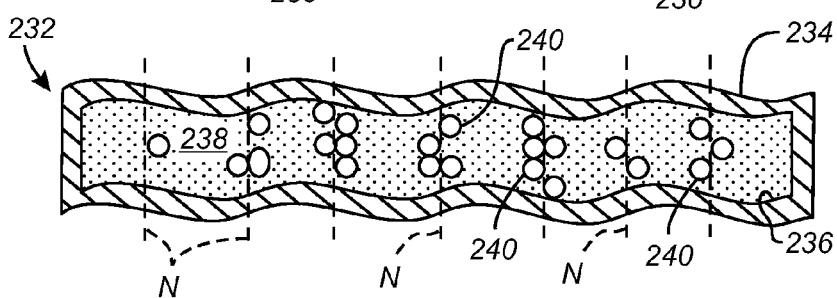
FIG. 15 shows a side cross-sectional view of an alternative suspended member with a plurality of positively buoyant nanobeads within a fluid filled chamber defined by a resilient outer shell forming various nodes in response to a driving frequency causing vibration of the suspended member.

Moreover, while the vibratory members of the resonators of FIGS. 12 and 15 are shown to extend over several wavelengths of the resonant frequency of the vibratory members, vibratory members in alternative embodiments may extend over less than one wavelength of the resonant frequency of the vibratory member. By way of example, the spring 126 of the resonator 118 of FIG. 2 may be designed such that the transfer arms 122 and 124 are always separated by a distance of ½ the wavelength of the resonant frequency of the spring 126 over the range of frequencies used to generate electrical energy. Such designs are useful when incorporating piezoelectric components because the antinode is predefined. Thus, the piezoelectric component may be pre-positioned at the location of the vibratory member exhibiting the greatest flexure. Of course, the resonators described herein are not limited to use with piezoelectric components. For example, in alternative embodiments, coil and magnet components, capacitive components, charged beams and magneto structures may be used.

While the present invention has been illustrated by the description of exemplary system components, and while the various components have been described in considerable detail, applicant does not intend to restrict or in any limit the scope of the appended claims to such detail. Additional advantages and modifications will also readily appear to those skilled in the art. The invention in its broadest aspects is therefore not limited to the specific details, implementations, or illustrative examples shown and described. Accordingly, departures may be made from such details without departing from the spirit or scope of applicant's general inventive concept.

The invention claimed is:

1. A method of powering a system with energy harvested from a vibrating surface, comprising:
   receiving a first mechanical energy at a first driving frequency from the vibrating surface;
   transferring the received first mechanical energy to a suspended structure within the system;
   vibrating the suspended structure with the transferred first mechanical energy;
   passively adjusting the resonant frequency of the suspended structure to a first resonant frequency associated with the first driving frequency by moving a movable mass in response to the movement of the suspended structure;
   vibrating the adjusted suspended structure with the transferred first mechanical energy;
   generating electrical energy using the vibrations of the adjusted suspended structure; and
   powering the system with the generated electrical energy.

2. The method of claim 1, further comprising:
   receiving a second mechanical energy at a second driving frequency from the vibrating surface;
   transferring the received second mechanical energy to the suspended structure;

vibrating the suspended structure with the transferred second mechanical energy;
passively re-adjusting the resonant frequency of the suspended structure to a second resonant frequency associated with the second driving frequency by moving the movable mass in response to the movement of the suspended structure resulting from the second mechanical energy;
vibrating the re-adjusted suspended structure with the transferred second mechanical energy; and
generating electrical energy using the vibrations of the re-adjusted suspended structure.

3. The method of claim 1, wherein passively adjusting the resonant frequency of the suspended structure to a first frequency comprises:
moving a first component within a channel in the suspended structure to a first antinode.

4. The method of claim 3, wherein passively adjusting the resonant frequency of the suspended structure to a first frequency comprises:
moving a second component within the channel in the suspended structure to a second antinode.

5. The method of claim 1, wherein passively adjusting the resonant frequency of the suspended structure to a first frequency comprises:
moving a first support member to a first node.

6. The method of claim 5, wherein passively adjusting the resonant frequency of the suspended structure to a first frequency comprises:
moving a second support member to a second node.

7. The method of claim 1, wherein generating electrical energy using the vibrations of the passively re-adjusted suspended structure comprises:
flexing a piezoelectric material with the suspended structure.

8. The method of claim 1, wherein generating electrical energy using the vibrations of the re-adjusted suspended structure comprises:
vibrating a transfer member with the suspended structure; and
flexing a piezoelectric material with the transfer member.

9. A wireless device, comprising:
a support structure configured to receive mechanical energy generated by a vibrating source external to the device;
a vibratory member operatively connected to the support structure for receiving mechanical vibrations from the support structure; and
a power harvesting subsystem including a resonator with at least one resonant frequency adjustment mass movably responsive to the vibratory member, such that vibration of the vibratory member causes the at least one resonant frequency adjustment mass to move thereby changing the resonant frequency of the vibratory member from a first resonant frequency to a second resonant frequency.

10. The wireless device of claim 9, wherein:
the vibratory member comprises a channel having fluid therein; and
the at least one resonant frequency adjustment mass is a bead located within the channel.

11. The wireless device of claim 10, wherein the bead is negatively buoyant within the fluid.

12. The wireless device of claim 9, wherein:
the support structure includes at least one support beam;
the at least one resonant frequency adjustment mass is movably coupled to and supported by the support beam; and
the vibratory member is operatively connected to the support structure through the at least one resonant frequency adjustment mass.

13. The wireless device of claim 12, wherein;
the at least one support beam comprises a first support beam and a second support beam;
the at least one resonant frequency adjustment mass comprises
a first transfer arm movably coupled to and supported by the first support beam and the second support beam, and
a second transfer arm movably coupled to and supported by the first support beam and the second support beam; and
the vibratory member is operatively connected to and supported by the support structure through the first transfer arm and the second transfer arm.

14. The wireless device of claim 13, further comprising:
a piezoelectric member located at a first position on the vibratory member; and
a vibratory mass supported by the vibratory member such that when the vibratory member vibrates, the first position is an antinode area of the vibratory member.

15. The wireless device of claim 9, wherein:
the vibratory member comprises a channel having fluid therein; and
the at least one resonant frequency adjustment mass is the fluid.

16. The wireless device of claim 9, wherein
the support structure includes a first frame and a second frame;
the vibratory member includes a first end portion fixed to the first frame and a second end portion fixed to the second frame; and
the at least one resonant frequency adjustment mass is located within the vibratory member.

* * * * *